(12) United States Patent
Imanishi

(10) Patent No.: US 8,545,969 B2
(45) Date of Patent: Oct. 1, 2013

(54) PATTERN-FORMED SUBSTRATE, PATTERN-FORMING METHOD, AND DIE

(75) Inventor: Shingo Imanishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 538 days.

(21) Appl. No.: 12/047,216

(22) Filed: Mar. 12, 2008

(65) Prior Publication Data

US 2008/0233361 A1 Sep. 25, 2008

(30) Foreign Application Priority Data

Mar. 20, 2007 (JP) ................................ 2007-073233

(51) Int. Cl.
*G03F 7/00* (2006.01)
*B41M 5/00* (2006.01)

(52) U.S. Cl.
USPC ........................................ 428/195.1; 430/323

(58) Field of Classification Search
USPC ............................... 428/195.1, 220; 430/323
See application file for complete search history.

(56) References Cited

U.S. PATENT DOCUMENTS

| | | | |
|---|---|---|---|
| 4,434,224 A * | 2/1984 | Yoshikawa et al. | 430/323 |
| 6,303,268 B1 * | 10/2001 | Namba et al. | 430/270.1 |
| 6,862,131 B2 | 3/2005 | Hamaguchi | |
| 2002/0110756 A1 * | 8/2002 | Watanabe et al. | 430/319 |
| 2005/0167868 A1 * | 8/2005 | Takeda et al. | 264/1.33 |
| 2005/0226999 A1 * | 10/2005 | Kouchiyama et al. | 427/162 |

FOREIGN PATENT DOCUMENTS

| | | |
|---|---|---|
| JP | 64-079743 | 3/1989 |
| JP | 09-311460 | 2/1997 |
| JP | 2002-311467 | 10/2002 |
| JP | 2003-315988 | 11/2003 |
| JP | 2006-310678 | 11/2006 |

OTHER PUBLICATIONS

Japanese Office Action issued on Feb. 24, 2009, for corresponding Japanese Patent Application JP 2007-073233.
Japanese Office Action issued on Aug. 18, 2009, for corresponding Japanese Patent Application JP 2007-073233.
Japanese Office Action for corresponding JP2007-073233 issued on Apr. 6, 2010.

* cited by examiner

*Primary Examiner* — David Sample
*Assistant Examiner* — Tahseen N Khan
(74) *Attorney, Agent, or Firm* — K&L Gates LLP

(57) ABSTRACT

A pattern-formed substrate is provided. The pattern-formed substrate includes a substrate base, an organic thin film and an inorganic resist film stacked on the substrate base in this order, and patterns having predetermined aspect ratios formed on the organic thin film and the inorganic resist film, respectively. The pattern of the organic thin film is formed by selective etching using the pattern of the inorganic resist film as a mask.

6 Claims, 3 Drawing Sheets

PATTERN-FORMED SUBSTRATE, PATTERN-FORMING METHOD, AND DIE

CROSS-REFERENCES TO RELATED APPLICATIONS

The present application claims priority to Japanese Patent Application JP 2007-073233, filed in the Japanese Patent Office on Mar. 20, 2007, the entire contents of which are incorporated herein by reference.

BACKGROUND

The present application relates to a pattern-formed substrate having a fine pattern with a desired aspect ratio, particularly a fine pattern with a high aspect ratio. The present application also relates to a method of forming a fine pattern with a desired aspect ratio, particularly a fine pattern with a high aspect ratio (hereinafter, also simply referred to a pattern-forming method). The present application further relates to a die used for such a pattern-forming method.

In the past, fine patterns have been formed using lithography techniques and etching techniques. For example, a fine pattern is formed on a substrate as follows. First, a photoresist film is formed on a substrate. The photoresist film is exposed through a mask having a predetermined pattern arranged on the film and then developed to form a resist mask. Subsequently, the surface of the substrate is selectively etched through the resist mask, thereby forming the fine pattern on the substrate. The photoresists known in the art include organic resists and inorganic resists.

On the other hand, a wire grid device has been known as one of optical devices. The wire grid device is an optical device that functions as a polarization beam splitter or a polarizer in which gratings are formed on a glass substrate with a pitch of about 140 nm to 150 nm and a height of about 200 nm, or metal fine lines are periodically formed on the substrate. Fine patterns for gratings of the wire grid device are formed using the aforementioned lithography techniques and etching techniques.

For example, Japanese domestic re-publication of PCT international application (A1) No. WO 2004/04796 discloses a technology for patterning with an inorganic resist made of oxides of tungsten (W) and molybdenum (Mo) in a lithographic process for the formation of a fine pattern in the manufacture of a master for optical-disk production.

An inorganic resist is suitable for micro-fabrication as a photoresist material used in a lithographic technology, because of the formation of a pattern at a bit width almost corresponding to the half width of a light-focusing spot and obtaining a pattern width to be an almost half width by lowering an exposing power. On the other hand, an organic resist material is suitable for the formation of a deep-groove pattern but the minimum pattern width is almost the same as the wavelength of the exposure light. Thus, the organic resist material may not be suitable for the micro-fabrication in some cases.

In the case of the inorganic resist, the side wall of a pattern formed by exposure to the inorganic resist has an inclination of about 50°. Thus, it is difficult to form a structure with a desired depth when narrowing the space between the patterns. On the other hand, in the case of using a photoresist pattern as an etching mask, a deep pattern may be required for ensuring a selection ratio. Therefore, a technology for forming deep patterns while keeping the patterns at fine intervals has been demanded.

SUMMARY

It is desirable to provide a pattern-formed substrate having a fine pattern with a desired aspect ratio, particularly a fine pattern with a high aspect ratio.

In addition, it is desirable to provide a pattern-forming method of forming a pattern having a fine pattern with a desired aspect ratio, particularly a fine pattern with a high aspect ratio and to provide a die used for such a pattern-forming method.

According to an embodiment, there is provided a pattern-formed substrate including an organic thin film and an inorganic resist film stacked on a substrate base in this order. Patterns having predetermined aspect ratios are formed on the organic thin film and the inorganic resist film, respectively. The pattern of the organic thin film is formed by selective etching using the pattern of the inorganic resist film as a mask.

The pattern-formed substrate according to an embodiment uses the two-layer film in which the organic thin film and the inorganic resist film are stacked on the substrate base. In this case, the pattern of the organic thin film is formed by selectively etching the organic thin film using the pattern of the inorganic resist film as a mask. Therefore, for example, the resulting pattern-formed substrate has a fine pattern with a high aspect ratio.

According to another embodiment, there is provided a pattern-formed substrate including a metal thin film formed on an optically transparent substrate base. A pattern having a predetermined aspect ratio is formed on the metal thin film. The metal thin film having the pattern is formed by transferring a die pattern to an organic film formed on the metal thin film on the substrate base by a nano-imprinting process and subjecting the metal thin film to selective etching using the organic thin film having the die pattern as a mask.

The pattern-formed substrate according to an embodiment includes the metal thin film having the pattern with a predetermined aspect ratio formed on the optically transparent substrate base. The metal thin film is formed by transferring the die pattern to the organic film formed on the metal thin film on the substrate base by the nano-imprinting process and subjecting the metal thin film to the selective etching using the organic thin film having the die pattern as a mask. Therefore, for example, the resulting pattern-formed substrate has a fine pattern with a high aspect ratio.

According to a further another embodiment, there is provided a method of forming a pattern. The method includes the steps of:
  forming an organic thin film and an inorganic resist film on a substrate base in this order;
  exposing and developing the inorganic resist film into a predetermined pattern; and
  selectively etching the organic thin film using the inorganic resist film having the pattern as a mask to form a pattern having a predetermined aspect ratio on the organic thin film.

According to the pattern-forming method of an embodiment, the two-layer film of the organic thin film and the inorganic resist film is formed on the substrate base. The upper layer, the inorganic resist film, is exposed and developed to form a fine pattern on the inorganic resist film. The fine-patterned inorganic resist film is used as a mask to selectively etch the lower layer, the organic thin film. Therefore, a fine pattern with a high aspect ratio can be formed on the organic thin film. Therefore, for example, the pattern-formed substrate can be produced with a fine pattern having a high aspect ratio formed on the surface of the organic thin film.

According to yet another embodiment, there is provided a method of forming a pattern. The method includes:

forming a first organic thin film and an inorganic resist film on a first substrate base in this order;

exposing and developing the inorganic resist film into a predetermined pattern;

selectively etching the first organic thin film using the inorganic resist film having the pattern as a mask to form a pattern having a predetermined aspect ratio on the first organic thin film;

subjecting the resulting pattern to plating to form a die on which the pattern is reverse-transferred;

pressing the die to transfer a pattern to a second organic thin film formed on a second substrate base to form the transferred pattern on the second organic thin film; and selectively etching the second substrate base side using the pattern of the second organic thin film as a mask.

According to the pattern-forming method of an embodiment, the two-layer film of the organic thin film and the inorganic resist film is formed on the substrate base. The upper layer, the inorganic resist film, is exposed and developed, thereby allowing the formation of a fine pattern on the inorganic resist film. The lower layer, the organic thin film, is selectively etched using the fine-patterned inorganic resist film as a mask, thereby allowing the formation of a fine pattern with a high aspect ratio on the organic film. Subsequently, a metal is plated on the resulting pattern and the plated metal is then removed, thereby forming a die having a reverse-transferred pattern. The die is press-transferred to another organic thin film formed on another substrate base to transfer the pattern of the die to the organic thin film. Subsequently, the organic thin film is used as a mask to selectively etch the substrate base side. As a result, for example, a pattern-formed substrate having a fine pattern with a high aspect ratio can be produced on the surface of the substrate. Such a method uses the die, so that the pattern-formed substrate can be produced in large quantities.

According to still another embodiment, there is provided a die including a metal-plating layer having a reverse-transferred pattern. The metal-plating layer is obtained by forming an organic thin film and an inorganic resist film on a substrate base in this order; forming a pattern having a predetermined aspect ratio on the organic thin film by patterning the organic thin film using a pattern formed on the inorganic resist film; and subjecting the pattern to metal-plating and detaching the layer after reverse-transferring the pattern.

In the die according to an embodiment, the two-layer film of the organic thin film and the inorganic resist film is used to form, for example, a pattern provided with a high aspect ratio on the organic thin film. The resulting pattern is subjected to metal-plating and the plated metal is then detached. Therefore, the die thus obtained can be one having a fine transferred pattern with a high aspect ratio.

According to an embodiment, the pattern-formed substrate having a fine pattern with a desired aspect ratio, particularly high aspect ratio can be provided.

In addition, according to an embodiment, the pattern-formed substrate having a fine metal pattern with a desired aspect ratio, particularly high aspect ratio can be provided.

According to the pattern-forming method of an embodiment, a substrate having a fine pattern with a desired aspect ratio, particularly high aspect ratio can be produced with high precision.

In addition, according to the pattern-forming method of an embodiment, a substrate having a fine metal pattern with a desired aspect ratio, particularly high aspect ratio can be formed with high precision in mass production.

According to an embodiment, the die having a fine transferred pattern with a desired aspect ratio, particularly high aspect ratio can be provided.

Additional features and advantages are described herein, and will be apparent from the following Detailed Description and the figures.

BRIEF DESCRIPTION OF THE FIGURES

FIGS. 1A to 1D represent the respective steps of the method (Part 1/3);

FIGS. 2A to 2C represent the respective steps of the method (Part 2/3); FIGS. 3A to 3D represent the respective steps of the method (Part 3/3).

DETAILED DESCRIPTION

Embodiments will be described in greater detail below with reference to the attached drawings.

FIGS. 1 to 3 illustrate a patterned substrate having a fine pattern with a high aspect ratio and a pattern-forming method according to the embodiments of the invention, respectively. In other words, the embodiments are applied to a pattern-formed substrate having a fine metal pattern with a high aspect ratio and a method of forming such a pattern.

Figure 1A:
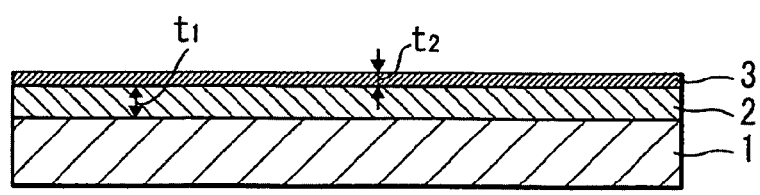
FIGS. 1A to 1D are schematic cross-sectional diagrams illustrating a pattern-forming method according to an embodiment, where

Referring to FIG. 1A, an organic thin film 2 with a desired film thickness t1 is formed on one principal surface of a substrate (e.g., silicon wafer) 1. The organic thin film 2 may be an organic resist, such as a polyvinyl alcohol (PVA) or a polymethyl methacrylate (PMMA). In this embodiment, therefore, an organic resist film is used as the organic thin film 2 and formed in a film thickness of about 150 nm by spin-coating. Subsequently, the organic resist film is baked at a predetermined temperature, for example, a high temperature of about 200° C. to completely evaporate a solvent while the rest is deactivated so as not to be exposed. Consequently, the organic thin film 2 of about 130 nm in thickness (=t1) is formed.

The organic thin film 2 is not limited to any of resists, so that the organic thin film 2 may be formed of a resin dissolved in an organic solvent or an aqueous resin.

Subsequently, an inorganic resist film 3 is formed on the organic thin film 2. The inorganic resist film 3 is formed in a film thickness of t2 which is smaller than the film thickness t1 of the organic thin film 2 (t2<t1). In this embodiment, the inorganic resist film 3 is prepared by forming an unsaturated tungsten oxide film (WOx film) in a film thickness t2 of about 40 nm by spattering. In this way, a two-layer film structure of the organic thin film 2 and the inorganic resist film 3 is formed on the substrate 1.

The inorganic resist material is an incomplete oxide of a transition metal, such as Ti, V, Cr, Mn, Fe, Nb, Cu, Ni, Co, Mo, Ta, W, Zr, Ru, or Ag. Among them, Mo, W, Cr, Fe, or Nb can preferably be used. Furthermore, Mo or W can be more preferably used in terms of attaining a large chemical change with UV or visual light.

Figure 1B:
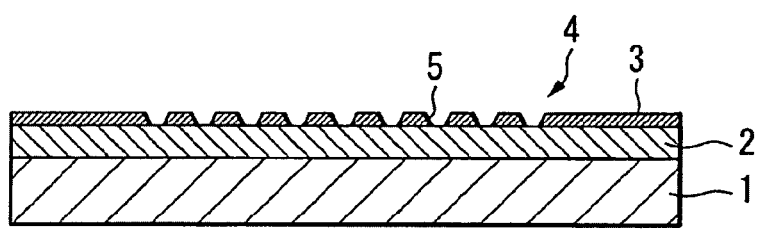

Next, as shown in FIG. 1B, a predetermined pattern is exposed and then developed on the upper layer of the two-layer film, the inorganic resist film 3, by direct laser drawing, thereby forming a first fine pattern 4 in which fine openings 5 are arranged in predetermined patterns. For example, the openings 5 are stripe-shaped fine grooves. A plurality of such fine-grooved openings 5 are arranged in parallel at predetermined intervals to form the first fine pattern 4.

According to an embodiment, a pulse train beam of a wavelength of 408 nm, a peak power of about 4 mW and a duty of about 40% at 66 MHz is focused and the exposure is then performed using an objective lens having a numeric aperture NA of 0.95 with an exposure groove distance of 150 nm and a linear velocity of about 5 m/s. After the exposure, the development is performed by pouring an alkali developing solution, such as NMD-3, on the substrate 1 for about 20 minutes while turning the substrate 1 around. Thus, a first pattern with a groove-width duty of about 50%, the groove pattern 4, can be only formed on the inorganic resist film, the WOx film 3. Here, the term "pulse train beam with a duty of 40%" means a pulse laser beam which is repeatedly switched on and off with the above cycle and the pulse width of on and off per cycle is 4:6.

Figure 1C:
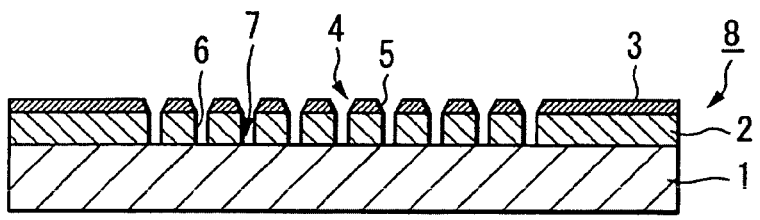

Subsequently, as shown in FIG. 1C, the inorganic resist film 3 having the first pattern 4 is used as a mask. The lower layer, the organic thin film 2, is selectively etched to form a second pattern 7 in which a plurality of openings 6 having a predetermined aspect ratio is arranged on the organic thin film 2 in predetermined patterns. For example, the second pattern 7 may be formed of a plurality of fine-grooved openings 6 having a predetermined aspect ratio arranged in parallel so as to correspond to the respective stripe-shaped fine-grooved openings 5 of the above inorganic resist film 3. The aspect ratio is represented by depth/width. Here, a first pattern-formed substrate 8 can be obtained, including the organic thin film 2 having the fine pattern 7 with a high aspect ratio formed on the substrate 1.

In an embodiment, the organic thin film 2 is subjected to a reactive ion etching with oxygen plasma using the inorganic resist film, the WOx film 3, as a mask. The etching is carried out at a gas pressure of about 0.5 Pa and an antenna power bias power of 50 W for about 30 seconds. The non-masked portion of the organic thin film 2, which is exposed by the development, is sufficiently etched. Consequently, the fine-grooved opening 6 reaches to the exposed portion of the substrate 1.

When the oxygen plasma is employed, oxygen reacts with the organic thin film 2 to favorably etch the organic thin film 2. It should be noted that if the selection ratio of the inorganic resist film 3 to the organic thin film 2 can be secured, the organic thin film 2 may be subjected to a dry etching using other gas than the oxygen plasma. In addition, the organic thin film 2 may be any of materials that originally do not have photosensitive groups. Furthermore, the inorganic resist film 3 is not limited to the WOx film. The inorganic resist film 3 may be made of any material as long as it satisfies the following conditions. It forms a groove width of half or less of an exposure beam spot by the process of thermal-recording and development or by the process of only thermal recording. In addition, a selection ratio to the lower layer, the organic thin film 2, can be sufficiently obtained and an etching resistance can be secured.

Subsequently, a die 10 on which the pattern 7 is reverse-transferred is formed using the first pattern-formed substrate 8.

Figure 1D:
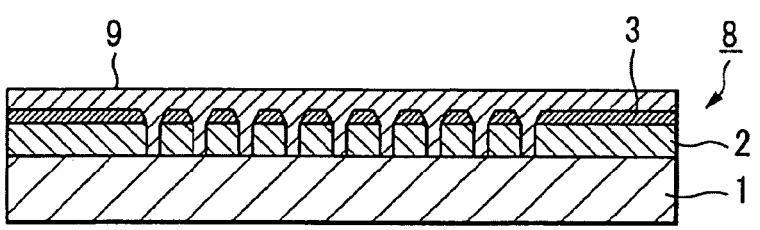

In other words, as shown in FIG. 1D, a metal-plating layer 9 is formed on the first pattern-formed substrate 8, the inorganic resist film 3, by metal-plating so that the openings 5 of the first pattern 4 and the openings 6 of the second pattern 7 can be filled therewith. The metal-plating layer 9 will become a die (stamper) later. According to this embodiment, nickel (Ni) is applied to the pattern-formed substrate 8 to form a film of about 10 nm in thickness and then subjected to a Ni-electroforming plating, thereby forming a metal-plating layer 9 of about 0.3 mm in thickness.

Figure 2A:
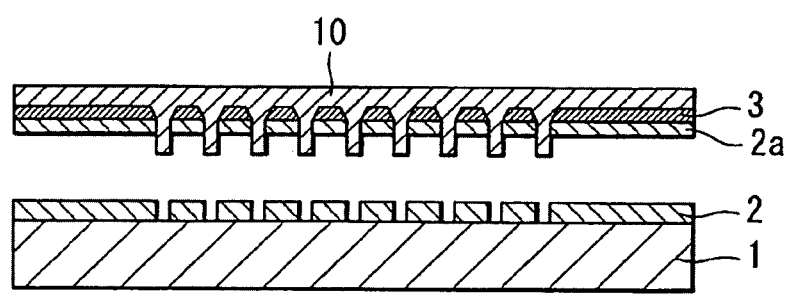
FIGS. 2A to 2C are schematic cross-sectional diagrams illustrating a pattern-forming method according an embodiment, where

Subsequently, as shown in FIG. 2A, the metal-plating layer 9 is detached from the pattern-formed substrate 8, so that a die (stamper) 10 can be formed from the metal-plating layer 9. When the die (stamper) 10 is detached from the pattern-formed substrate 8, the residue 2a of the inorganic resist film 3 and the organic thin film 2 is attached to the surface of the die 10.

Figure 2B:
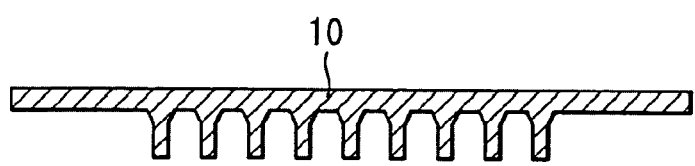

Therefore, as shown in FIG. 2B, the die 10 is subjected to a washing treatment to remove the inorganic resist film 3 and the residue 2a of the organic thin film from the surface of the die 10. According to an embodiment, first, the residue 2a is removed from the surface of the die 10 by oxygen-plasma ashing. Subsequently, the die 10 is dipped in an alkali developing solution and a voltage of about +1 V is then applied to the die 10 to anodize the die 10. In this case, Ni does not cause oxidization because the applied potential is lower than its ionization potential. Thus, the inorganic resist film, the WOx film 3, is only oxidized and then dissolved in the alkali developing solution. The solution for removal of the inorganic resist film 3 is not limited to the developing solution and may be an electrolyte as long as it does not corrode Ni, the die 10.

A fluorine-removing agent is applied to the washed die surface by, for example, spin-coating and then washed with a solvent, thereby forming a water-repellent thin film of several nanometers in thickness on the surface of the die 10. The water repellent finish is not only limited to such a technique. It may be carried out by a vapor treatment or the like.

Figure 2C:
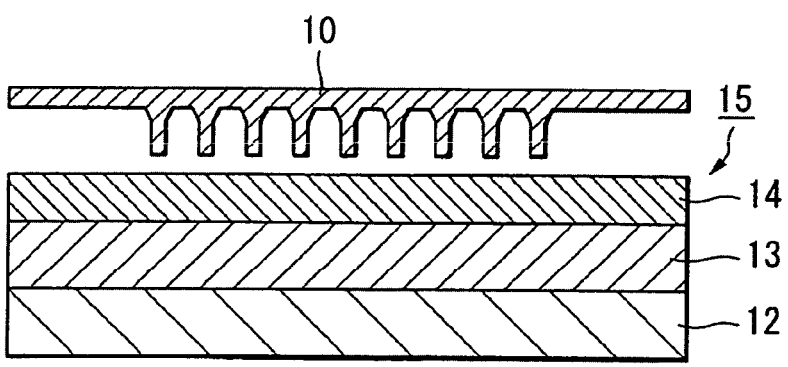

Next, as shown in FIG. 2C, a metal thin film 13 with a desired film thickness is formed on an optically transparent substrate, for example, a glass substrate 12. Subsequently, an organic thin film 14 in a predetermined thickness is formed on the metal thin film 13. The metal thin film 13 capable of attaining a reflectance of 90% or more is preferable.

In an embodiment, an aluminum alloy (for example, one based on Japanese Industrial Standards (JIS) A6061) is formed by spattering in a film thickness of about 200 nm as a metal thin film 13 on a glass substrate of about 1 mm in thickness. A nano-printing resist film made of a thermoplastic resin is formed by spin-coating in a thickness of about 200 nm as an organic thin film 14 on the aluminum-alloy film 13. A three-layer structure of the resist film, the aluminum alloy film, and the glass substrate forms a substrate on which what is called nano-printing is carried out.

In this way, a base 15 is prepared so that both the metal thin film 13 and the organic thin film 14 are formed on the optically transparent substrate 12 in this order. Thus, for example, the base 15 is prepared as a base for the formation of an optical device. Subsequently, the die 10 is arranged so as to face the base 15.

Figure 3A:
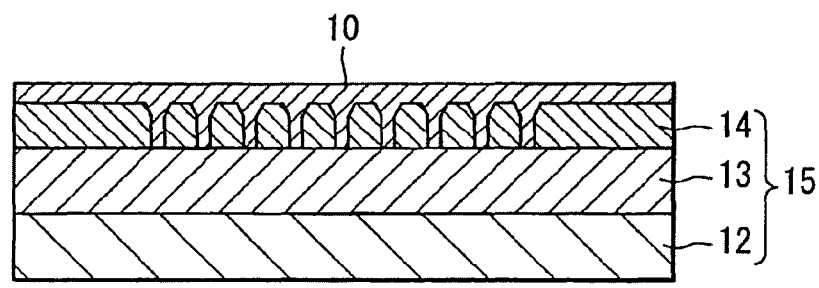
FIGS. 3A to 3D are schematic cross-sectional diagrams illustrating a pattern-forming method according an embodiment, where

Next, as shown in FIG. 3A, the base 15 is heated up to a temperature (for example, about 180° C.) sufficiently higher than the softening point of the organic thin film 14 (for example, 115° C.). Simultaneously, the die 10 is brought into firm contact with the organic thin film 14 and then pressed at a predetermined pressure. For example, it is pressed at a pressure of about 15 MPa.

Figure 3B:
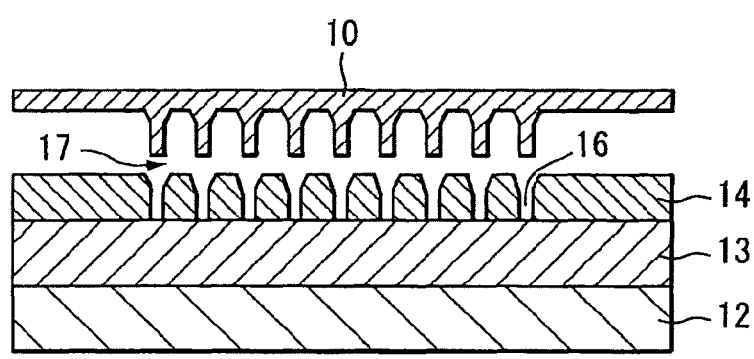

Subsequently, as shown in FIG. 3B, the die 10 is kept in a state of being pressed, while the base 15 is cooled to a temperature (for example, 60° C.) sufficiently lower than the softening temperature of the organic thin film 14. After that, the die 10 is depressurized and detached from the base 15. Consequently, the pattern of the die 10 is reverse-transferred to the organic thin film 14. In other words, a pattern 17 of fine openings 16, for example a plurality of stripe-shaped fine grooves arranged in parallel, is formed on the organic thin film 14. After the detachment of the die 10, a residual organic film remains on the bottom of the pattern 17 of the organic thin film 14. However, such a residue may be removed by carrying out an appropriate degree of an oxygen-plasma ashing to expose the surface of the lower layer, the metal thin film 13.

Figure 3C:
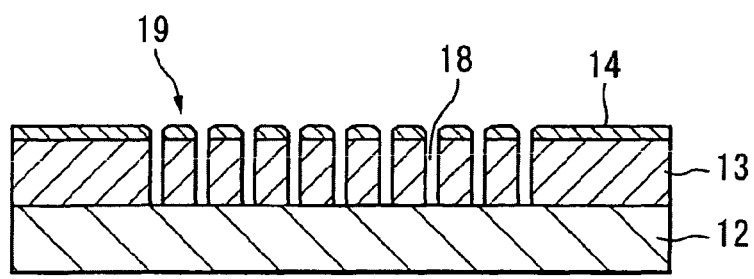

Subsequently, as shown in FIG. 3C, the organic thin film 14 on which the pattern 17 is transferred is used as a mask to selectively etch the lower layer, the metal thin film 13. The selective etching forms a metal pattern 19 having openings 18 with a desired aspect ratio, for example, a metal pattern having a plurality of stripe-shaped fine grooves arranged in parallel. According to this embodiment, the pattern 19 is transferred to the metal thin film 13 made of an aluminum alloy film by reactive ion etching with chlorine plasma using the organic thin film 14 as a mask.

The etching is performed while adjusting the process conditions to control the selection ratio or keeping the thickness of the organic thin film 14.

Figure 3D:
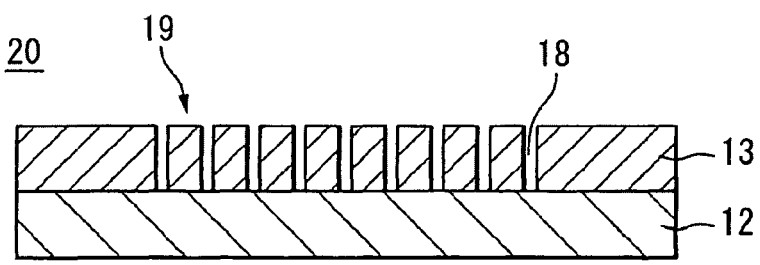

Finally, as shown in FIG. 3D, oxygen-plasma ashing is carried out to remove the organic thin film 14 being remained as a mask. As a result, a second pattern-formed substrate, particularly a metal pattern-formed substrate 20, in which a metal pattern 19 with a desired aspect ratio is formed on the optically transparent substrate 12, is formed. The metal pattern-formed substrate 20 can be applied as a functional substrate depending on a purpose, for example, as an optical device.

The metal pattern 19 formed on the substrate 12 by the above pattern-forming method has a pitch of openings 18, a groove pitch of 150 nm in this embodiment. The pitch is sufficiently shorter than the wavelength of visible light. Thus, a form birefringence acts on the metal pattern 19, so that the metal pattern 19 can be used as an optical device, particularly as a wire grid having the functions of a polarization beam splitter. Alternatively, the metal pattern 19 may be used as a diffraction grating.

The pattern-forming method according to an embodiment is preferably applied to form a pattern with an aspect ratio (i.e., the aspect ratio of patterned openings (e.g., patterned grooves)) of 1.5 or more. Specifically, the method is suitably applied to form the pattern in which the minimum width of the pattern bottom portion (the bottom or the patterned opening) is 100 nm or less and the depth of the pattern (the depth of the patterned opening) is 150 nm or more. A wire grid with high precision can be obtained when the aspect ratio is 1.5 or more, specifically, the minimum width of the pattern bottom portion is 100 nm or less, and the pattern depth is 150 nm or more. That is, the more the depth of the pattern increases, the more the separation of the S-polarized light and the P-polarized light improves.

Here, when a pattern bottom width is 100 nm and a line-and-space duty ratio is 50%, a pattern cycle becomes 20 nm which is half the shortest wavelength of human visible light region. In other words, if the pulse width is larger than 100 nm, diffracted light is generated in addition to the effect of a form birefringence. In addition, for example, the depth of the pattern is preferably 150 nm or more, because a sufficient extinction ratio for a wire grid may need the depth of 150 nm or more. The actual range of the pattern depth may be in the range of 170 nm to 200 nm.

The structure of the substrate for nano-imprinting is not specifically limited to the above embodiment, so that it may be a substrate having another structure using a pattern for a nano-imprinting resist for the purpose of forming a fine shape. For example, the layer structure of the substrate for nano-imprinting of a fine shape may be one using a two-layer substrate including a resist film and a silicon wafer. A pattern is formed on the substrate by nano-imprinting and then subjected to Ni-plating to make a die duplicate.

According to the above embodiment, a two-layer film of the organic thin film 2 and the inorganic resist film 3 is formed on the substrate 1. The fine pattern 4 is formed on the inorganic resist film 3. The fine-patterned inorganic resist film 3 is used as a mask to carry out selective etching of the organic thin film 2, thereby forming the pattern 7 that attains both the desired fine shape and the desired pattern depth. In other words, the pattern-formed substrate 8 having the fine pattern 7 with a high aspect ratio, particularly the fine pattern with an aspect ratio of 1.5 or more on the organic thin film 2 can be obtained (see FIG. 1C). In addition, the inorganic resist film 3, for example the WOx film, is arranged on the uppermost surface and functioned as a mask, so that the organic thin film can be provided with a high resistance to the oxygen-plasma etching and a sufficient selection ratio even if the film thickness is small.

Furthermore, the pattern-formed substrate 8 is used to form the die 10. The die 10 is then subjected to a pressing process and a selective etching process. Consequently, a fine and precise substrate 20 formed with a metal pattern can be obtained. In the substrate 20, a fine metal pattern 19 with a high aspect ratio is formed on an optically transparent substrate 20.

Therefore, in particular, the pattern-forming method of this embodiment allows a high-precision production of an optical device, such as a wire grid with high polarization splitting properties or a diffraction grating.

The first pattern-formed substrate 8 as described above is used as a substrate having a fine pattern in the step carried out before the formation of the die 10. Alternatively, the first pattern-formed substrate 8 itself may be used as a functional substrate depending on the purpose.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A pattern-formed substrate, comprising:
   a substrate base;
   an organic thin film and an inorganic resist film stacked on the substrate base in this order, wherein the inorganic resist film is an incomplete oxide of a transition metal; and
   patterns having predetermined aspect ratios formed on the organic thin film and the inorganic resist film, respectively, wherein the pattern of the organic thin film is formed by selective etching using the pattern of the inorganic resist film as a mask, and wherein the pattern-formed substrate has a predetermined aspect ratio of over 1.5, the predetermined aspect ratio defined by a pattern depth to the width at a pattern bottom portion.

2. The pattern-formed substrate according to claim 1, wherein
   the pattern formed on the organic thin film has a minimum width of 100 nm or less at the pattern bottom portion and the pattern depth of 150 nm or more.

3. The pattern-formed substrate according to claim 1, wherein the organic thin film is one of a polyvinyl alcohol and a polymethyl methacrylate.

4. The pattern-formed substrate according to claim 1, wherein the organic thin film is formed in one of a resin dissolved in an organic solvent and an aqueous resin.

5. The pattern-formed substrate according to claim 1, wherein the inorganic resist film is prepared by forming an unsaturated tungsten oxide film by spattering.

6. The pattern-formed substrate according to claim 1, wherein a predetermined pattern is exposed and then developed on the inorganic resist film by direct laser drawing to form stripe shaped fine grooves arranged in parallel at predetermined intervals.

* * * * *